United States Patent [19]

Baer

[11] Patent Number: 5,777,342
[45] Date of Patent: Jul. 7, 1998

[54] METHOD AND APPARATUS FOR MICROLITHOGRAPHY

[76] Inventor: Stephen C. Baer, 10 Poplar Rd., Cambridge, Mass. 02138

[21] Appl. No.: 581,185

[22] Filed: Dec. 29, 1995

Related U.S. Application Data

[63] Continuation-in-part of Ser. No. 275,967, Jul. 15, 1994, abandoned.

[51] Int. Cl.$^6$ .................................................. H01L 21/268
[52] U.S. Cl. .................................................. 250/492.2
[58] Field of Search ....................... 250/442.2; 430/139, 430/396

[56] References Cited

U.S. PATENT DOCUMENTS

| | | | |
|---|---|---|---|
| 3,013,467 | 12/1961 | Minsky | 356/432 |
| 3,513,980 | 5/1970 | Petráň et al. | 210/238 |
| 3,705,755 | 12/1972 | Baer | 359/202 |
| 4,100,571 | 7/1978 | Dykes et al. | 358/87 |
| 4,460,828 | 7/1984 | Harvey | 250/329 |
| 4,471,470 | 9/1984 | Swainson et al. | 365/127 |
| 4,917,462 | 4/1990 | Lewis et al. | 359/368 |
| 5,034,613 | 7/1991 | Denk et al. | 250/458.1 |
| 5,121,256 | 6/1992 | Corle et al. | 250/492.2 |
| 5,153,873 | 10/1992 | Spruit et al. | 369/275.2 |
| 5,268,862 | 12/1993 | Rentzepis | 365/151 |
| 5,289,407 | 2/1994 | Strickler et al. | 365/106 |
| 5,384,464 | 1/1995 | De Fornel et al. | 250/492.2 |

FOREIGN PATENT DOCUMENTS

| 2613845 | 10/1984 | France | 250/461.1 |
|---|---|---|---|

OTHER PUBLICATIONS

S. Inoué, "Imaging of Unresolved Objects, Superresolution, and Precision of Distance Measurement with Video Microscopy" in Taylor and Wang, *Fluorescence Microscopy of Living Cells in Culture, Part B* San Diego, U.S.A. 1989 pp. 85–112, Academic Press, Inc.

Toraldo di Francia, "Super-Gain Antennas and Optical Resolving Power" Nuovo Cimento, Suppl.9, Bologna, Italy, 1952 pp. 426–435.

Fukumoto and Kubota, "Superresolution of Optical Discs Using a Small Aperture," Jpn. J. Appl. Phys. vol. 31, Tokyo, Japan 1992 pp. 529–533 Feb. Part 1, No. 2B.

Yanagisawa and Ohsawa, "Superresolution in Optical Disc Systems with a Non-Linear Refractive Layer" *Jpn. J. Appl. Phys.* vol. 32, Tokyo, Japan 1993 pp. 1971–1974. May Part 1, No. 5A.

Denk, et al Two-Photon Laser Scanning Fluorescence Microscopy, *Science*, vol. 248, Washington, U.S.A. 1990, pp. 73–76.

Sheppard and Gu, "Image Formation in Two-Photon Fluorescence Microscopy" *Optik* vol. 86, No. 3, Stuttgart, Germany 1990, pp. 104–106.

(List continued on next page.)

*Primary Examiner*—Jack I. Berman

[57] ABSTRACT

In microlithographic systems, adapted for economical production of microchips with exceptionally small critical dimensions without exposure of the chip to potentially damaging radiation, wherein a beam of light is focused to a spot in photoresist layer excite a photoactive molecule in the spot, the effective size of the excitation is made smaller than the size of the spot by providing a beam of light of wavelength adapted to quench the excitation of the excitable species, shaping this second beam into a pattern with a central intensity minimum, and overlapping this central minimum with the central intensity maximum of the focused spot, so that within the spot the intensity of quenching light increases with distance from the center of the spot, thereby preferentially quenching excitation in the peripheral parts of the spot, and thereby reducing the effective size of the excitation and thus improving the resolution of the system. Systems where many such spots are simultaneously projected onto a resist layer, and simultaneously narrowed by quenching allow images of great complexity to be transfered quickly to the photoresist layer.

20 Claims, 9 Drawing Sheets

OTHER PUBLICATIONS

Strickler and Webb, Two–Photon Excitation in Laser Scanning Fluorescence Microscopy, Proc. SPIE. vol. 1398, Bellingham, WA, U.S.A. 1990, pp. 107–118.

Parthenopoulos and Rentzepis, "Three–Dimensional Optical Storage Memory" *Science*, vol. 245, Washington, DC, U.S.A., 1989, pp. 843–845.

Hegedus and Sarafis, "Superresolving Filters in Confocally Scanned Imaging Systems", J. Opt. Soc. Am. A, vol. 3, Washington, DC, U.S.A. 1986,pp. 1892–1896.

Arimoto and Kawata, "Laser–Scan Fluorescence Microscope with Annular Excitation" *Optik* vol. 86, No. 1, Stuttgart, Germany, 1990, pp. 7–10.

S. Hell, "Improvement of Lateral Resolution in Far–Field Light Microscopy by Using Two–Photon Excitation with Offset Beams," *Optics Communications*, vol. 106, Amsterdam, The Netherlands, 1994, pp. 19–24.

S. Hell and J. Wichmann, "Breaking the Diffraction Resolution Limit by Stimulated–Emission–Depletion Fluorescence Microscopy" *Optics Letters* vol. 19, Washington, U.S.A. 1994, pp. 780–782.

M. Levenson, N. Viswanathan and R. Simpson, Improving Resolution in Photolithography with a Phase–Shifting Mask. IEEE Trans. on Electron Devices. vol. ED–29, No. 12, New York, USA, 1982, pp. 1828–1836.

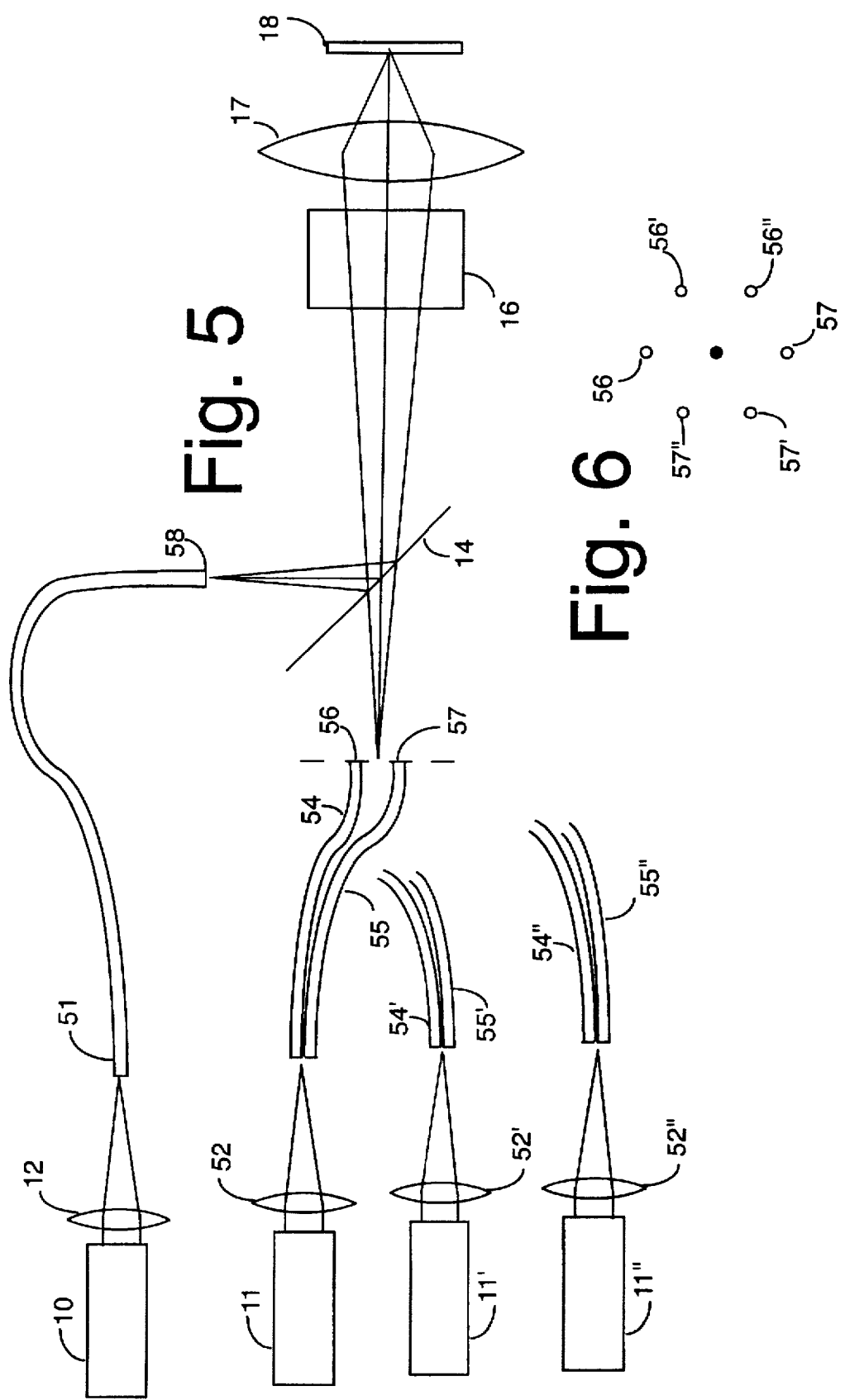

METHOD AND APPARATUS FOR MICROLITHOGRAPHY

The present invention is a continuation-in-part of U.S. patent application Ser. No. 08/275,967, now abandoned, filed Jul 15, 1994.

FIELD OF THE INVENTION

The present invention relates to systems for microlithography, specifically microlithography in the production of integrated circuit chips, and still more specifically to systems for economically producing chips with exceptionally fine critical dimensions without damage to the chip.

BACKGROUND OF THE INVENTION

For many years, progress in improving the density of elements in microchips made by a lithographic process has been limited by the Rayleigh diffraction resolution limit. This barrier has been attacked on three fronts: using light of shorter and shorter wavelengths, replacement of light by electron and ion beams, and by X-rays, and use of various superresolution techniques. However the superresolution techniques employed so far have been limited to less than about a doubling in effective resolution, and the other proposed solutions all create problems of their own. As wavelengths move further and further into the ultraviolet, there are far greater demands on the lenses and resists, and the light sources and other aspects of the equipment dramatically increase in cost. The use of X-rays requires very expensive masks, and results in radiation damage to the microchip, which necessitates additional annealing steps in fabrication, which may still leave some residual damage. The use of electron and ion beams causes radiation damage, charge deposited on the exposed wafer can deflect incoming particles, reducing resolution, and collisions between the incoming particles and the molecules of the resist results in scattering or production of electrons which can also limit resolution. In view of these problems, small gains in resolution have come at great cost, and in some cases the cost has been too great to make the proposed methods commercially viable. Because of the enormous current investment in optical microlithographic technology in the industry, any innovation whereby resolutions equal or greater to those produced by the use of X-rays or particle beams could be achieved with purely optical exposure techniques could be extremely valuable.

OBJECTS AND ADVANTAGES

It is the primary object of the present invention to make possible economical production of microchips with exceptionally small critical dimensions by improvement in the resolution of optical microlithographic systems for wafer exposure.

Another object of the present invention, in such systems, is to avoid exposing the chip, during its production, to potentially damaging charged particle beams or X-rays.

Another object of the present invention is to produce a microlithographic system with a resolution which is not limited by scattered electrons within the photoresist layer.

Another object of the present invention, is to allow a larger depth of field for a given resolution and wavelength than available with other techniques, thereby placing less stringent requirements on flatness of field of the imaging optics and wafer substrate than is required with other techniques.

Another object of the present invention is permit compensation for surface absorption by photoactive molecule or other components of the photoresist layer, thereby improving the depth profile of features in the chip.

Another object of the present invention is to allow a high throughput of chips, with a resultant economy, while at the same time allowing extremely high resolution.

Another object is provide a method of resolution enhancement which will work synergistically with known superresolution methods thereby increasing the resolution over these known techniques.

Another object is to provide a resolution enhancement technology which can be adapted to the fields of high resolution nanofabrication and digital computer memory storage and retrieval.

Another object is to allow upgrade of present optical microlithographic facilities with at a smaller cost than possible with other techniques which provide comparable resolution.

Still other advantages of the present invention will become evident in this disclosure.

SUMMARY OF THE INVENTION

The foregoing objects are achieved and the foregoing problems are solved in one illustrative embodiment of the invention, applied specifically to the field of microlithography. A wafer of silicon or other substrate is coated with a photoresist medium containing a photoactive molecular species which responds to light of an exciting wavelength by triggering a relatively stable local chemical change, the "latent image," but in the short interval between the absorption of the exciting photon and the creation of the latent image, undergoes an obligatory excited state which is susceptible to optical quenching. A photon of a wavelength adapted to quenching the transient excited state can return the molecule to the ground state without triggering the formation of the local chemical change. This specially prepared wafer is then placed on a novel laser scanning microlithographic exposure tool, wherein, as in a conventional laser scanning tool, a scanned excitation beam is focused to a diffraction limited spot size and illuminates successive diffraction limited spots on the wafer, exciting photoactive molecules within these spots. However, as each of these spots is exposed, or immediately after such exposure, within the short interval of the excited state, a beam of the quenching wavelength, shaped into a pattern with a central minimum is focused on the spot of excitation light, so that the central point of the spot and the central point of the central minimum of the quenching beam coincide, and so that within the central minimum region, the intensity of the quenching beam, and consequently the degree of quenching of the excitation of the photoactive molecules, increases with distance from the central point, thereby decreasing the effective width of the distribution of probability of excitation as a function of distance from the center of the illuminated spot, and consequently increasing the effective resolving power of the instrument. Following such exposure the photolithographic layer is developed, etched, or otherwise appropriately processed, either for a subsequent lithographic stage, or for dicing and packaging.

BRIEF DESCRIPTION OF THE DRAWINGS

The principles of the invention will be more particularly discussed with reference to the accompanying drawings in which:

(FIG. 1A and FIG. 1B are collectively referred to in this specification as "FIG. 1");

FIG. 5 is a schematic cross-sectional view of a portion of another variant of the device shown in FIG. 1 to illustrate the use of a plurality of optical fibers to transmit excitation and quenching radiation in the device;

FIG. 6 is a view showing the arrangement of the non-illuminated ends of the fibers in the device shown in FIG. 5;

DESCRIPTION OF THE INVENTION

Figure 1:
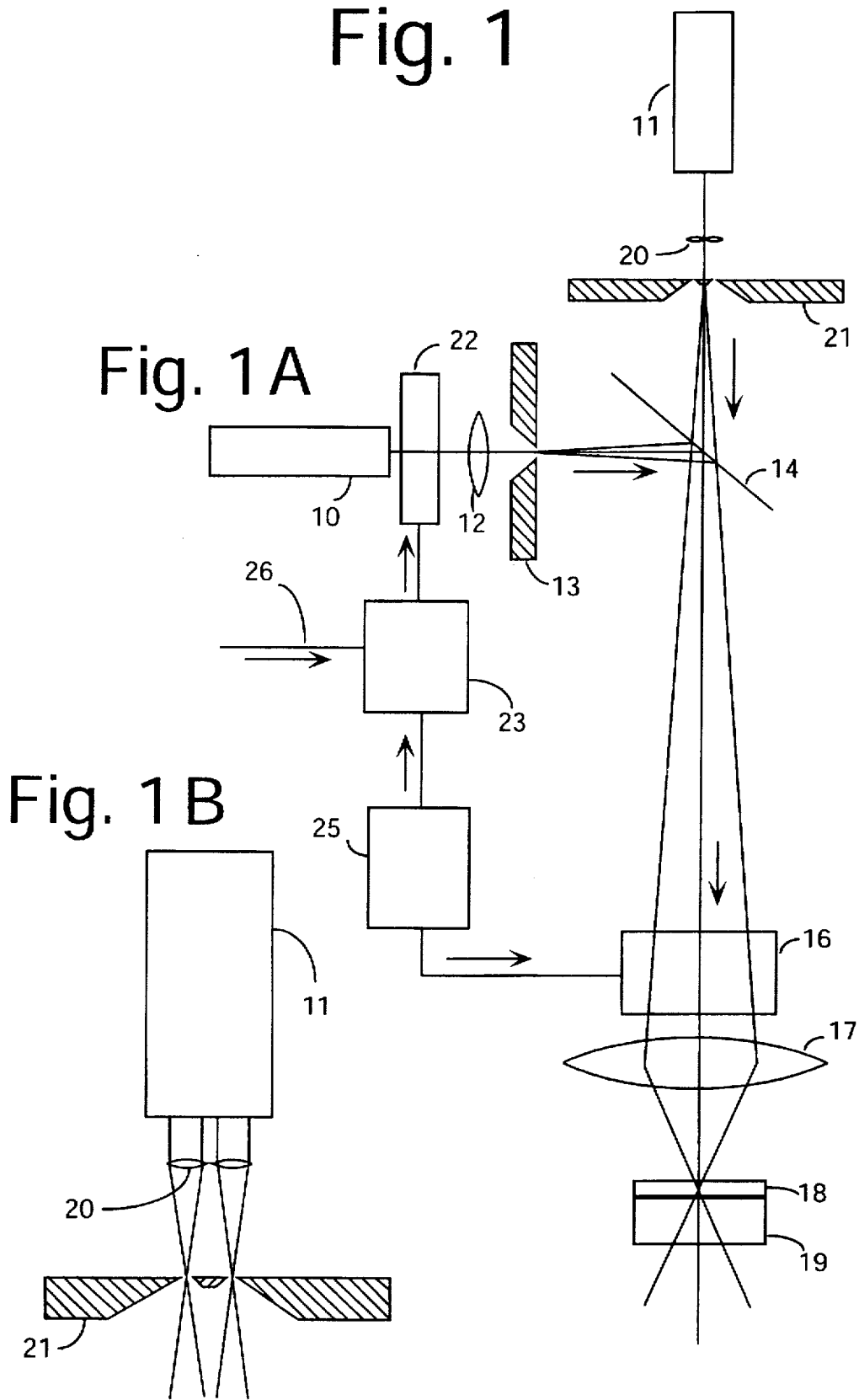
FIG. 1A is a schematic cross-sectional view of a laser scanning wafer exposure tool embodying the invention.
FIG. 1B is an enlarged view of the view shown in FIG. 1A.

FIG. 1 shows an embodiment of the present invention employing continuous wave laser illumination in a point scanning exposure tool. Light from excitation laser 10 is focused by lens 12 onto pinhole aperture 13, and after passing through aperture 13, reflection from dichroic mirror beam splitter 14 and scanning by beam scanning means 16 (which may be a pair of orthogonal galvanometer powered scanning mirrors) the laser light is imaged by lens 17 (which is shown as a single element, but may actually consist of a plurality of elements) on or within the photoresist layer 18 on wafer 19, the layer 18 containing photoactive molecules excitable by light emitted by laser 10, to form a region of excited photoactive molecules at the image of pinhole aperture 13. The photoactive molecules are chosen so that the excitation beam produces a transient excited state in the molecule which, after a brief time, trigger a more stable chemical change, spoken of as the "latent image" which causes a change in solubility of the photoresist. The photoactive molecules are additionally selected so that the transient excited state can be optically quenched by light of an appropriate wavelength, such wavelength lying in a spectral region where the photoresist layer, as a whole, is relatively transparent, and such that if quenched prior to the triggering of the stable chemical change, the photoactive molecule will revert to its ground state without triggering said chemical change.

Quenching laser 11, which emits light of a wavelength adapted to quench the excitation of the photoactive molecules caused by laser 10, is focused by toroidal lens 20 onto annular aperture 21. Light passing through aperture 21 then passes through dichroic beam splitter 14, and beam scanning means 16, and is focused by objective 17 onto the photoresist layer 18 coated on wafer 19. In FIG. 1A, for purposes of illustration only, rays are show emanating from the central point of annular aperture 21 to simplify the illustration and to show that this central point is conjugate, with respect to beam splitter 14, to the central point of pinhole aperture 13, and it should be understood that since this central region of annular aperture 21 is in fact opaque, rays do not actually emanate from this central point. In FIG. 1B, a magnified detail showing laser 11, toroidal lens 20 and annular aperture 21, the rays are correctly shown focused by lens 20 onto and then emanating from the transparent ring of aperture 21. The mirror image relationship between the center of annular aperture 21 and pinhole aperture 13 insures that the projected image in the photoresist 18 of annular aperture 21 is concentric with the image in the specimen of pinhole aperture 13. The diameter of annular aperture 21 is chosen so that the diameter in the specimen of the central ring of maximum intensity is the same as the diameter of the first minimum of an Airy disc point diffraction image which would be formed at the wavelength of the quenching laser 11. This means that the diameter in the specimen of the ring of maximum intensity for the quenching radiation is larger than the diameter of the first minimum of the point diffraction image of pinhole 13 by the ratio of the wavelength of the quenching laser to the wavelength of the excitation laser.

To produce an image on the photoresist, as the beams from lasers 10 and 11 are simultaneously scanned over the photoresist layer 18, the intensity of just the excitation beam is modulated by electrooptical intensity modulator 22, the input of which is the analog converted output of a digital frame memory 23, the read addresses of which are the digitally converted output of the scan driving circuit 25. By means of data input line 26, a digitally encoded frame is entered into frame memory 23, the frame of which represents the image projected into photoresist 18.

Figure 2:
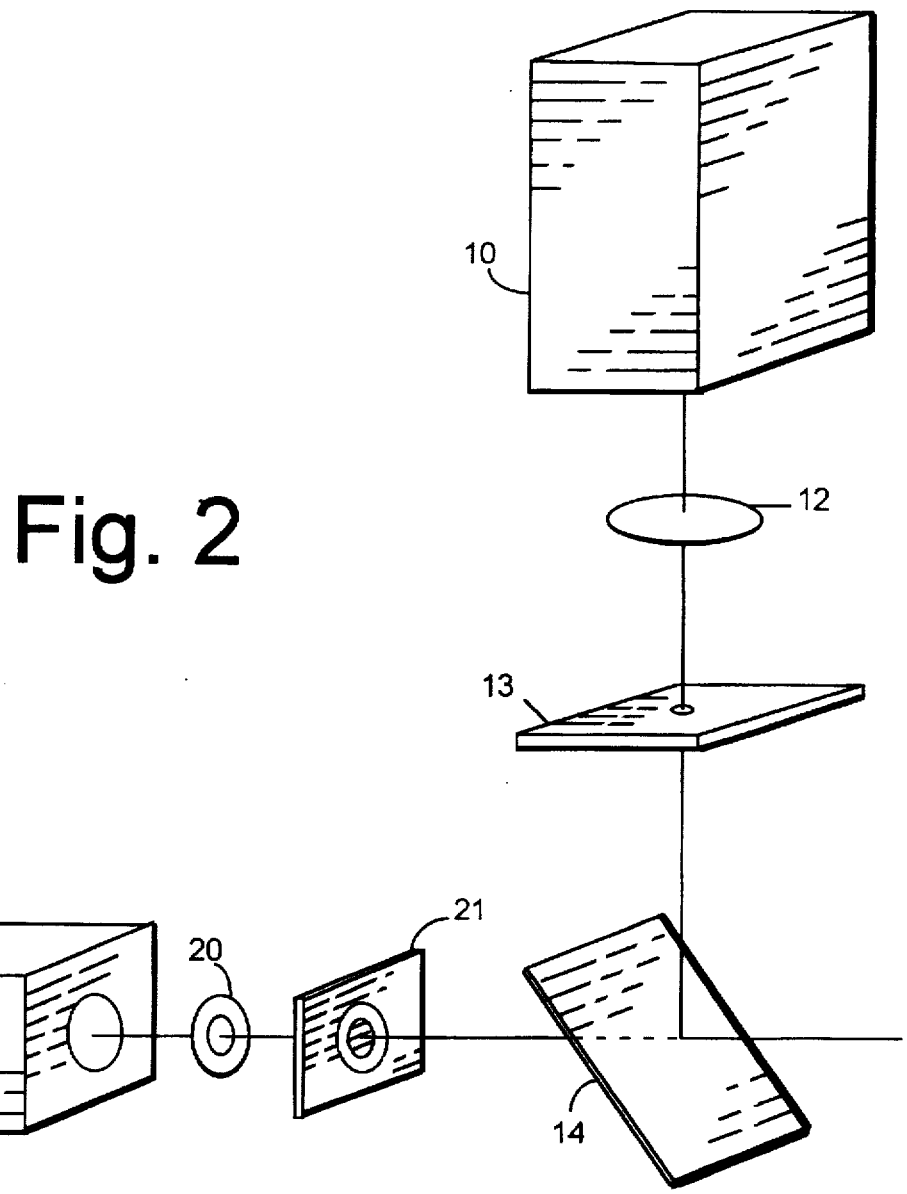
FIG. 2 is a perspective view showing a portion of the device of FIG. 1.

FIG. 2 shows a perspective detail of a portion of the apparatus of FIG. 1. It should be noted that for purposes of illustration, the openings of pinhole aperture 13 and annular aperture 21 are shown larger than the scale of the rest of the elements in this figure. Also it should be noted that the beam from quenching laser 11 is shown horizontal in this figure but vertical in FIG. 1. Although in principle, completely different optical systems could be used to project a central minimum of quenching radiation so its center coincides in the photoresist layer with the central point of the central maximum of the exciting radiation, for use in a scanning microlithographic application, the sharing of focusing optics, made possible by the use of beam splitter 14, insures that provided the focusing and scanning systems are achromatic, the required coincidence between the central points of these images will be guaranteed even at the precision required in high resolution photolithography, once the apertures 13 and 21 are aligned at one scan position, because perturbations, for example due to inhomogeneities in the optical path above and within the photoresist layer, distort the excitation and quenching beams equally. In case focusing optics which have been achromatized for the choice of excitation and quenching wavelengths are unavailable, it is possible to longitudinally shift aperture 21 relative to the position conjugate to aperture 13 with respect to beam splitter 14, so that the images of the two apertures are coplanar and concentric in the photoresist layer. Since such an arrangement will only provide correction for the axial focal point, scanning can be provided in such an arrangement, for example by lateral movement of the wafer.

Figure 3:
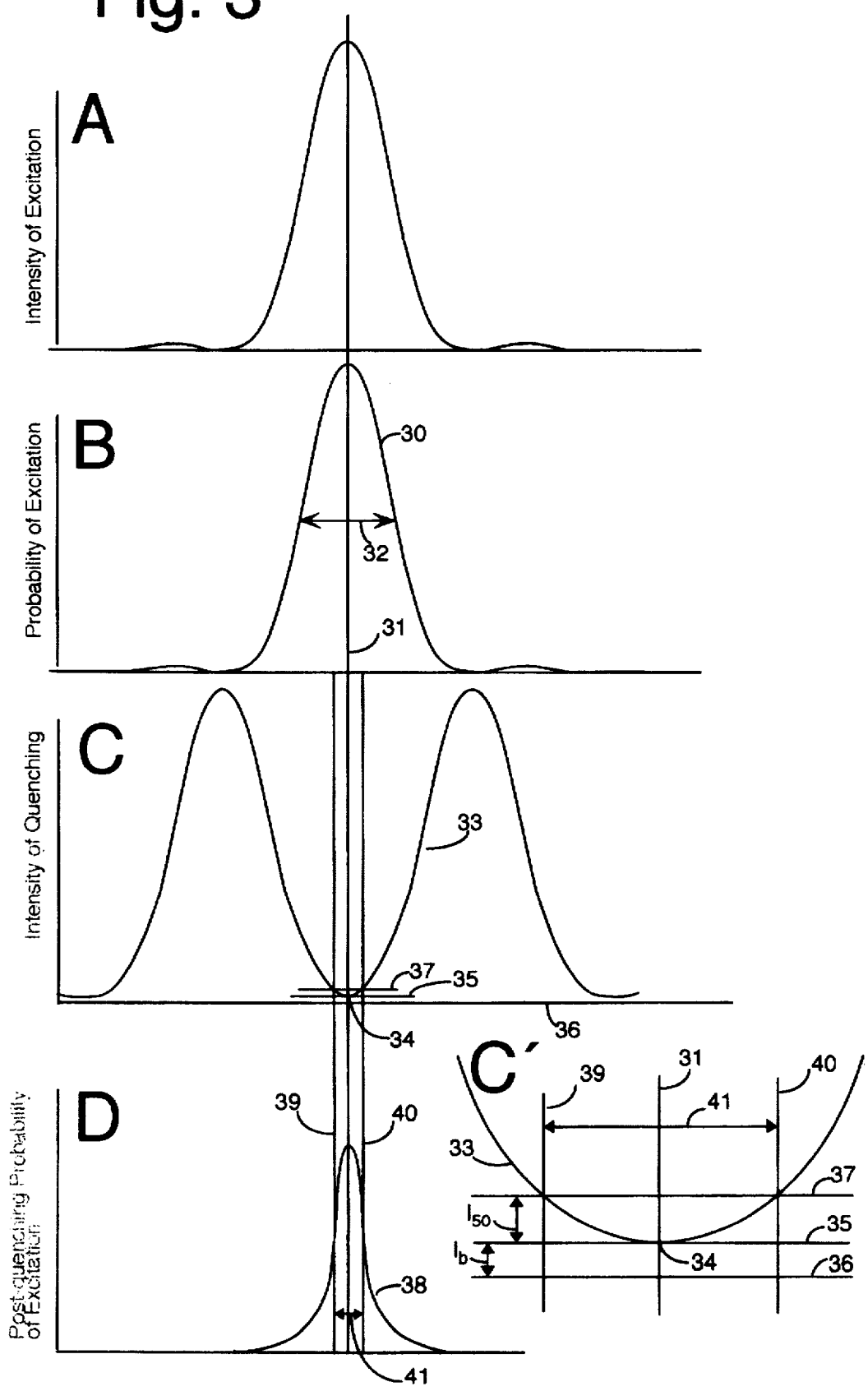
FIGS. 3 (A, B, C, C', and D are graphs) showing the intensity distributions at the plane of focus for the excitation and quenching beams, and the resultant excitation probability distribution due to the joint interaction of these beams with the photoresist layer.

Why the present invention will cause an improvement in resolving power is shown in FIG. 3, which shows how quenching, applied according the present invention, can reduce the nominal width of the distribution indicating the probability that a given photoactive molecule in the photoresist will be in its excited state, as a function of the distance of this molecule from the center of the central maximum of the focused excitation beam. To simplify this illustration, it is assumed that this probability of excitation of the photoactive molecule is proportional to the intensity of exciting illumination incident on the molecule. Secondly, the illustration is applied specifically to the imaging of the central spot of the imaging field, where the center of the spot intersects the optical axis of the objective 17.

FIG. 3A shows the expected light intensity distribution of the "Airy disc" or diffraction image of excitation pinhole aperture 13 projected in the photoresist 18 by objective 17. The use of the axial point as the example in this illustration means that the spatial coordinate in the distribution is simply the distance, in the plane of focus, from the axis of objective 17, this distance being shown by distance from the vertical line 31 common to FIGS. 3A, B, C and D. The vertical axis in these figures represents either light intensity or excitation probability, where the upward direction corresponds to increases. The description of imaging of non-axial points is somewhat more complicated than this present axial case, but resolution enhancement works in the same way. FIG. 3B shows the probability of excitation 30 of a photoactive molecule as a function of the distance in the focal plane between the axis and that molecule. The assumption of a proportional excitation response by the photoactive molecule means that this excitation probability distribution 30 shown in FIG. 3B is proportional to the diffraction image distribution shown in FIG. 3A. In a case where the excitation probability was not proportional to excitation intensity, for example because excitation saturated the population of photoactive molecules causing the top of the central maximum of curve 30 in FIG. 3B to be flattened with respect to the curve of FIG. 3A, the following arguments for the shrinkage of the width of the excitation probability curve are still valid.

The nominal width of the central maximum of the excitation probability distribution (without any resolution improvement due to quenching) is shown by the double arrow 32, which measures the distance between the two points in the distribution where the probability of excitation is half maximal. (When this distribution is imagined in the two dimensions of the plane of focus, double arrow 32 indicates the diameter of the circle where the probability of excitation is half the maximum probability). The object of the present invention is to apply the quenching radiation in a pattern which preferentially decreases the probability of resulting excitation in peripheral portions of the central maximum of the excitation probability curve, while sparing, as much as possible, the probability of excitation in the central portion, thereby narrowing the nominal width of the probability of excitation curve.

FIG. 3C shows the expected intensity distribution 33 of the image, projected in the photoresist layer, of annular aperture 21, which is illuminated by the quenching beam. The mean radius of annular aperture 21 is such that, by diffraction theory, the diffraction image in the specimen resulting from the contribution from each small section on the ring of annular aperture 21, taken in isolation, has an intensity of zero on the optical axis (i.e., the first minimum passes through the optical axis), so that as the light emanating from each of the small sections on the ring of aperture 21 summates to create an image of annular aperture 21 in the specimen, the sum, at this central axial point, of the zero intensities from each of the sections of the aperture 21 still adds to zero. However, scattering in the optics of the instrument and in the photoresist layer, and reflections from lower lying layers of the wafer, causes the central minimum on the optical axis, in fact, to have a small but finite intensity $I_b$ shown by the horizontal line 35, which is above the zero intensity baseline 36. The term "central minimum" is used herein analogously to the more common expression "central maximum" and refers to the fact the image has a minimum at its center, even if the image as a whole is not centered with respect to the optical axis, as when non-axial points are imaged.

In the following discussion, it is assumed that once a given photoactive molecule is excited, it has a probability p of leading to formation of the latent image, and that for a wide range of initial conditions, such as different mixtures of exciting vs. quenching light, and different concentrations of photoactive molecules, that adding to the existing light mixture the same intensity of quenching light, called $I_{50}$, which is different for different species of photoactive molecule, will reduce p to half its value before such addition. It should be emphasized that the assumption may not be completely valid in view of factors such as saturation, but it will nevertheless help illustrate several aspects of how quenching can improve resolution.

For a given total power of the quenching beam and a given species of photoactive molecule, it is possible to see approximately how much sharpening of resolution will result with the present system by determining the intensity of quenching radiation which must be mixed with an excitation beam to reduce its effective rate of excitation of the photoactive molecules by 50%. This intensity is shown by the double arrow labeled $I_{50}$ in FIG. 3C, which shows a detail from FIG. 3C in magnification.

It is assumed that due to factors such as scattering in the optics and the photoresist, there is a small but finite intensity of the quenching beam at the central point of the central minimum of the quenching beam, shown by the double arrow labeled $I_b$. The addition of more quenching light of intensity $I_{50}$ therefore will bring the total intensity of quenching light to the level shown by the line 37 which has a intensity of $I_b+I_{50}$. By definition of $I_{50}$, then, at the distance from the central maximum where the intensity of the quenching beam is $I_b+I_{50}$, shown by the vertical lines 39 and 40, the efficiency of excitation in producing a latent image is half the efficiency in the center of the central maximum. Because the excitation beam is also most intense at the center, the full width at half maximum of the probability-of-latent-image-production curve, post quenching is actually narrower than the distance between lines 39 and 40, shown by the double arrow 41. It can be seen that by simply increasing the total power of the quenching beam, which thereby shortens the double arrow 150, that the double arrow 41 can be arbitrarily reduced. FIG. 3D shows the distribution 38 of the probability of photoactive molecule excitation, subject to quenching by the quenching beam, (the "probability-of-latent-image-production") and it can be understood that this distribution can be arbitrarily narrowed, by reducing double arrow 41 by means of increasing the quenching beam power.

Of course, there is a limit to how much quenching radiation can be directed onto the photoresist layer before that layer is damaged by heating, therefore the ability of the photoresist to tolerate high quenching beam powers may be the major resolution determining factor in the present system for microchip fabrication. Furthermore, it will be appreciated that as the total power for the quenching beam increases, so does the intensity of the central point of the central minimum, $I_b$, and consequently the effective sensitivity of the process is reduced. Therefore another design objective in the present system is to reduce the intensity of the central point of the central minimum of the quenching beam to the lowest practical level, in order to preserve the sensitivity of the process, while achieving good resolution improvement.

FIG. 3 also shows that only a small part of the energy of the quenching beam, in the central part where the intensity is lowest, is involved in resolution enhancement. This means that for each milliwatt of laser energy needed in the crucial central part of the quenching laser beam, a total beam power of perhaps hundreds of milliwatts may be required. However such powers are easily attainable with available lasers. Furthermore, high intensities of the quenching beam in the bright ring surrounding the central minimum do not degrade the image because the final excitation probability of the photoactive molecule can never be lower than zero, so high quenching intensities will saturate at zero excitation. Therefore, from the point of view of image quality, the intensity of the quenching beam can be adjusted for optimal sharpening at the center of the intensity minimum, without worry about the high intensities surrounding the central minimum. By choice of a quenching wavelength where there is negligible absorption by the photoresist except by excited photoactive molecules, thermal effects on the photoresist of the quenching beam are minimized. Thermal effects might also be reduced by use of a high thermal conductivity substrate for the silicon, for example diamond, and by cooling the wafer during exposure.

Under the same the conditions described above to produce the minimum in the focal plane, which of course is perpendicular to the optical axis, the intensity distribution measured along the optical axis also has a minimum sharing the same central point. As is the case with microscope objectives generally, in which the width of the central maximum of the point diffraction image, measured in the focal plane perpendicular to the optical axis, is smaller than the width measured along the optical axis, resulting in a better lateral resolution than longitudinal resolution, this same elongation along the optical axis occurs with the central minimum of the diffraction image of the annular aperture 21, so that in general, following resolution enhancement by the apparatus shown in FIG. 1, longitudinal resolution will also be improved by quench sharpening, but the lateral resolution will still be better than the longitudinal resolution.

Because (at least near the focal point) excitation of the photoactive molecule due to the cone of rays converging to the focal point and the cone of rays diverging from the focal point are eliminated by quenching, only the in-focus rays at the focal point remain for formation of the latent image. Therefore the present system permits extending the practical depth-of-focus, by scanning in depth in addition to scanning laterally. This is particularly useful in more parallel forms of image formation discussed below, where the same image would be formed at many different closely spaced focus settings, to produce a composite image which is sharp at every depth of the photoresist layer. Additionally, by increasing the intensity of the image for deeper layers, it is possible to compensate for absorption of the excitation light by superficial layers of the resist, and the resulting distortion of depth profiles of the features formed in the resist.

In the present invention, a requirement for the photoresist is that it have a short lived excited state, susceptible to radiational quenching, between the time a photoactive molecule absorbs a photon from the excitation beam and the time the resultant excited state of the photoactive molecules commits the photoresist to form a latent image. Even though many references describing photoresist photochemistry show the exciting photon as directly initiating a chemical step, in fact, typically the light absorption event is separated in time from the first chemical change, and the direct product of the light absorption event is a singlet electronically excited state, which is susceptible to optical quenching through the process of stimulated emission. In such a quenching process, the energy of the quenching photon is the same as the energy of the transition from the excited state to either the ground state of the molecule or to a vibrationally excited ground state. If absorption of the exciting photon puts the photoactive molecule in a vibrationally excited level of the singlet state, stimulated emission quenching is also possible from this state, so there is no need to wait for the photoactive molecule to decay to the ground vibrational level of the singlet state prior to quenching. A second transitional excited state often necessary for the light absorption to trigger the latent image is a triplet excited state, to which the singlet state can decay by the process of intersystem crossing. The triplet state is relatively immune to radiational quenching by stimulated emission, so that the strategic time for radiational quenching in the present invention is the singlet state, prior to intersystem crossing to the triplet state.

One way to find candidate photoresist compositions which would be usable with the present invention, is to inspect published absorption spectra for various photoresists. The longest wavelength peak in the blue or near u.v. probably corresponds to the lowest singlet state, and a high absorption for this peak would suggest sensitivity both for excitation and quenching. If with increases in wavelength, this absorption peak falls off quickly to reach a very low absorption, the shortest wavelength where the absorption has become negligible would be a good wavelength for the first trial setting of the quenching beam wavelength. Low absorption in the band of the quenching beam is important both to allow high quenching powers to be used without undue heating of the photoresist due to absorption by the resin component of the photoresist, and to reduce the likelihood that the quenching beam would directly excite the photoactive molecule to trigger a latent image. For example, a paper by Hiraoka and Yamaoka (Microelectronic Engineering 13: 61 (1991)) shows a polymer film of poly (phenylsilsesquioxane)/hexamethoxymethylmelamine/ triphenylsulfonium hexafluoroantimonate has a u.v. peak with an absorption maximum at about 310 nm, and the film becomes transparent at around 360 nm. Therefore this film has potential use in the present invention with excitation at the peak of the absorption band at 310 nm and quenching at around 360 nm. Interestingly this photoresist has an even stronger absorption peak near 230 nm, but since with the present invention, resolution is determined principally by the quenching beam rather than by the resolution of the excitation beam, there might not be enough advantage with excitation at the shorter wavelength to warrant any additional equipment expense to allow use of this shorter wavelength. A paper by Pawlowski et al (Microelectronic Engineering 13: 29 (1991) shows absorption spectra that suggest that resists based on a matrix resin of substituted polyhydroxysterenes may be suitable with excitation at around 280 nm and quenching at around 300 nm. A search through the hundreds of available photoresist formulations would doubtless yield many other candidates. Since the particular requirements for the present invention are somewhat different from other applications, for example in the requirement for exceptional transparency of the resist at the long wavelength end of a sharp absorption peak, some modification of existing formulations might yield the best resist for use with the present invention.

Figure 4:
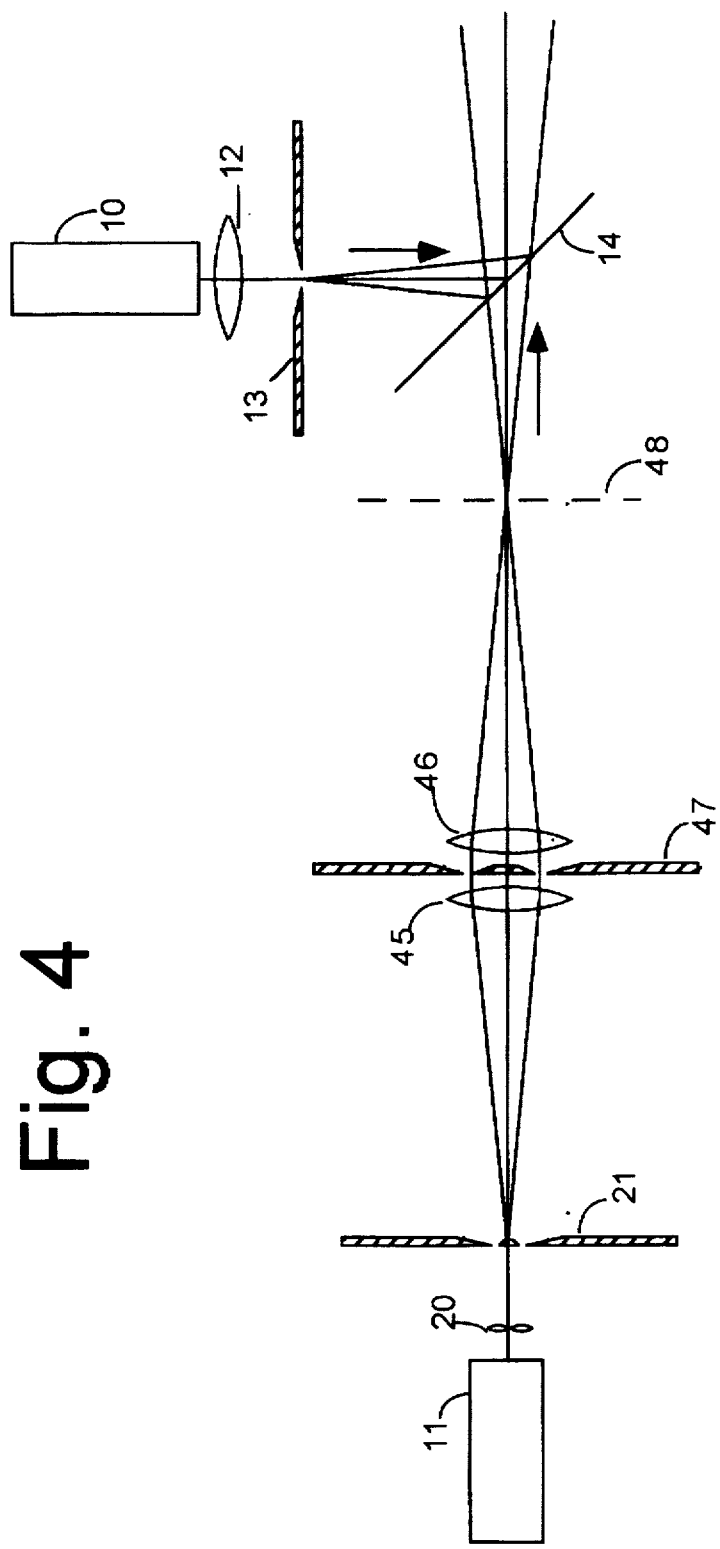
FIG. 4 is a schematic cross-sectional view of a portion of a variant of the device shown in FIG. 1 to illustrate the use of an annular aperture in an aperture plane to further increase resolving power and increase depth of field.

FIG. 4 shows how the resolution produced by the present invention might be increased by combining the field plane annular aperture used in the present invention to create in the photoresist layer a quenching beam pattern with a central minimum, with an aperture plane annular aperture to improve the lateral resolution of that quenching beam pattern. (Born and White, Principles of Optics, 3rd edition, p. 416). A relay lens system consisting of lenses 45 and 46 with annular aperture 47 in an aperture plane, images annular aperture 21 onto a real image plane 48 which is conjugate to pinhole 13 relative to the beam splitting mirror 14 (i.e., real image plane 48 is in the same plane as annular aperture 21 in FIG. 1 before being displaced to the position shown in FIG. 4). The diameter of annular aperture 21 is readjusted to cause the central minimum in its image in the photoresist layer to have a minimum intensity. The use of an aperture plane annular aperture 47 in addition to the field plane annular aperture 21, causes the central minimum in the specimen to have a smaller width, to improve lateral resolution, and at the same time to have a reduced resolution in the axial dimension for improved depth-offield. Instead of the annular aperture 47 in the aperture plane of the relay lens system, there can be a complex aperture of different annuli, each with specified phase retardation and opacity, for further decreases in the width of the central maximum, as shown originally by Toraldo di Francia (Nuovo Cimento, Suppl. 9: 426 (1952)). It should be noted that in the design of such an aperture plane aperture 47, it is more important to maximize the sharpness of the first minimum of the point spread function rather than the usual design criterion of maximizing the sharpness of the central maximum. (Che central minimum might also be "sculpted" to optimize, for example, a particular desired tradeoff between image brightness and resolution, by replacing the uniform ring of aperture 21 with a series of annuli of independently controllable phase retardation and absorption, in addition to the choice of phase retardations and absorptions for annular rings in the aperture plane aperture 47.) It should also be appreciated that a major problem with Toraldo type aperture plane apertures, namely the defection of beam power away from the central maximum, causing reduced contrast, is overcome in the present invention, because, as described above, light from the quenching beam outside the central minimum does not degrade image contrast.

The resolution of the device shown in FIG. 1 can be considerably improved by providing a 180 degree phase shift between the quenching light passing through segments of the annular aperture 21 on diametrically opposite sides. This is because in an Airy disc pattern, even though the intensity distribution rises with distance from the ring of the first minimum in the direction either towards the central maximum or away from it, the oscillation associated with the electric field changes phase upon movement across the first minimum, so the field always has the opposite sign in the central maximum and the first bright ring. Therefore, if Airy discs from a coherent source are formed so that on the line connecting the centers of their central maxima, their first minima coincide, and therefore near this line, where the central maximum from one of the discs overlaps the first bright ring of the other, there will be destructive interference as the electric fields contributed by the two Airy discs cancel. This causes the intensity distribution to rise relatively slowly near the central minimum of the quenching beam, which therefore decreases the resolution improvement due to quench sharpening, which is dependent on the sharpness of the intensity distribution of the quenching beam near the central minimum. One solution is employ as quenching laser 11, a laser with inherently low coherency. The excimer laser has the right coherency properties, but unfortunately is a pulsed laser with too low a frequency to be practical in a scanned laser device such as the device of FIG. 1, however it might be usable in the more parallel type of device shown in FIG. 8 below. In addition to improving resolution, increasing incoherence of the light has the added advantage in reducing degradation in imaging performance due to speckling. However coherency can be turned to an asset by providing a 180 degree phase shift in the light emanating from segments on opposite sides of the annular aperture 21, so that the electric fields from the central maximum from one Airy disc has the same sign as that of the first bright ring from the other Airy disc, and consequently there is constructive interference, and the intensity distribution rises even more rapidly than in the case these Airy discs are mutually incoherent.

FIG. 5 shows an arrangement for providing the required 180 degree out-of-phase coherence for minimizing the width of the central minimum of the quenching beam, while minimizing the undesirable effects of coherence between light emerging from adjacent segments on the field aperture 21 of FIG. 1. Light from excitation laser 10 is focused by lens 12 onto one end of optical fiber 51, and light emerging from the other end 59 of fiber 51 is reflected from dichroic mirror 14, and directed through beam scanning means 16 to lens 17, which focuses this excitation light to a spot on the photoresist layer 18. Three lasers 11, 11' and 11", each within the band of effective quenching, but of wavelengths far enough from each other that they are mutually incoherent, have their output beams focused by lenses 53,53' and 53" onto three pairs of phase-preserving optical fibers, one pair containing fibers 54 and 55 being illustrated along their full length. The non-illuminated ends of these fibers, for example end 56 and 57, are in the plane 58, that is conjugate to the photoresist layer 18, and consequently is the same plane occupied by annular aperture 21 in FIG. 1. By mechanically adjusting fiber end 56 with respect to fiber end 57 (the means for such adjustment is not illustrated) the quenching light emerging from these ends, on plane shown by the dotted line, is 180 degrees out of phase. (Alternatively the light emerging from the fibers could be in phase, and a phase retarding filter could be inserted in front of one of the fibers.) As shown in FIG. 6, which shows a cross section through plane shown by the dotted line the ends 56 and 57 are at diametrically opposite vertices of a hexagon, and the separation between ends 56 and 57 is such that at the wavelength of laser 11, the Airy discs of these fiber ends projected into the photoresist have their first minima passing through the central point of the central maximum of the Airy disc projected by lens 17 on the photoresist 18 from light emerging from the end 52 of fiber 51. Dichroic mirror 14 makes the end 58 of fiber 51, conducting excitation light, conjugate to the central point of the hexagon of non-illuminated ends 56, 56', 56", 57, 57' and 57", but it is also possible to locate the end 58 physically within that hexagon, so that dichroic mirror 14 is unnecessary.

Figure 7:
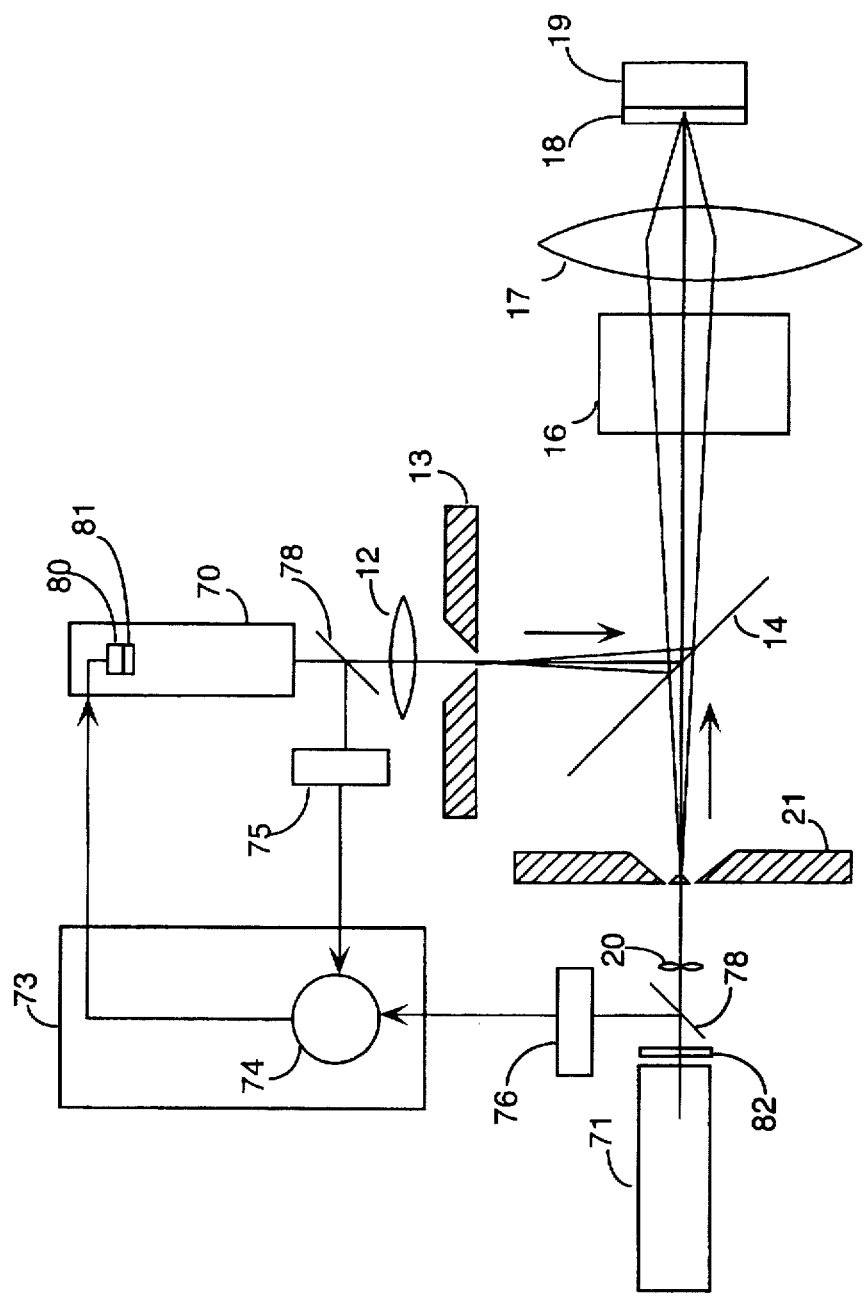
FIG. 7 is a schematic cross-sectional view of the present invention wherein the excitation and quenching beams are presented as successive ultrashort pulses.

FIG. 7 illustrates an embodiment of the present invention employing synchronized ultrashort-pulse (shorter than a few picoseconds), repetitively pulsing lasers for excitation and quenching. In particular, the pulse output from the lasers is adjusted so that the quenching beam is turned on within picoseconds of the offset of the excitation beam, before there has been any time for significant conversion of the singlet excited state of the photoactive molecule to the relatively optically unquenchable triplet state or the stable latent image, so that the quenching beam has the possibility of eliminating the formation of the latent image. There are significant advantages of such a pulsed laser embodiment of the present invention compared to embodiments wherein the excitation and quenching beams are continuously on. Most importantly, there is more efficient quenching per watt of average quenching beam power. This may be understood from a specific example where the excitation pulse frequency is assumed to be 100 MHz, and the transient excited singlet state of the photoactive molecule is assumed to have a 10 picosecond half-life. (For the purpose of this example it is assumed that the conversion of the transient excited state to the latent image is very efficient, so in the absence of optical quenching, the excited almost always leads to formation of the chemical change which constitutes the latent image.) If it is assumed that each quenching photon incident on the photoactive molecule has a 20% probability of quenching it, then 10 incident photons together would have about a 90% chance of producing quenching. If these 10 quenching photons were delivered within 100 femtoseconds following each excitation, then substantially all the quenching would take place before there was an opportunity for conversion to the latent image so the resulting quenching would be 90%. However if these 10 quenching photons were emitted by a continuous wave laser, so they arrived spaced over the 10 ns interval between excitation pulses, before the first quenching photon arrived after the excitation pulse, there would have been nearly a 100% likelihood of conversion to the latent image, and obviously any quenching photons which arrived after such conversion would have no effect. In other words, bunching the photons in the interval immediately after excitation greatly improves the quenching efficiency. The quenching efficiency can be further increased in a pulsed system by making the excitation and quenching lasers have the same polarization, so there is insufficient time for a significant change in direction of polarization by rotation of the photoactive molecule between excitation and quenching, hence the quenching laser will be optimally aligned with the excited molecules.

In FIG. 7, excitation laser 70 and quenching laser 71 could be ultrashort pulse mode-locked lasers, using, for example, optically pumped Ti-sapphire, dye or Cr-forsterite as the active medium, and perhaps frequency multiplied, for excitation in the blue or ultraviolet. These types of lasers result in a repetitive train of pulses of durations from about 100 femtoseconds to several picoseconds, and at a frequency of about 50 to 100 MHz which depends on the length of the laser cavity. Lasers 70 and 71 are synchronized by means of a phased locked loop synchronizing circuit 73, which, by means of phase detector 74 detects phase difference between the amplified and filtered electrical outputs of high frequency response photodetectors 75 and 76, which receive a portion of the output beams of lasers 70 and 71 respectively by means of beam splitters 77 and 78. The output 79 of circuit 73, representing a correction signal to stabilize the desired phase difference between the pulse trains from the two lasers, is applied to a piezoelectric actuator 80 which controls the longitudinal position of one of the end mirrors 81 of the cavity of laser 70, thereby adjusting the laser pulse frequency, and thus stabilizing this phase difference. The desired phase difference, where the pulse from laser 71 follows the offset of the pulse from laser 70 by an interval from zero to several picoseconds can be adjusted either electrically in circuit 74, for example by adding a controlled phase shift to one of the inputs of phase detector 74, or optically by means of adjusting the optical path difference between the outputs of the two lasers. A commercially available unit to implement circuit 73 is the Model 3930 Lok-to-Clock™ Electronics Control from Spectra-Physics Lasers, Inc., Mountain View, Calif., which can be used when the lasers 70 and 71 are Spectra-Physics Model 3960C Tsunami™ Ti-sapphire lasers. FIG. 7 also shows a frequency doubling crystal 82, which can be optionally placed in the beam path of the quenching laser to halve the output wavelengths This frequency doubling crystal 82 is representative of such frequency doubling, tripling or quadrupling means which can be placed in the path of either or both lasers to decrease the output wavelength. Both lasers 70 and 71 may be pumped by a common argon ion laser (unillustrated) with a divided output. Apart from the lasers 70 and 71 and their synchronizing apparatus, all the elements in the embodiment shown in FIG. 7 are substantially identical to and serve substantially the identical function to the respective elements shown in FIG. 1, so they are numbered with the same numerals as FIG. 1, and are described by the text corresponding to FIG. 1.

Many alternative methods of producing two beams of synchronized ultrashort pulses are known in the art. The synchronization between lasers 70 and 71 could be by means of a purely optical coupling, for example by having both lasers optically pumped by the pulsed output of a synchronous pumping laser (Moritz, N. et al, Optics Comm. 103: 461(1993)). Still another possibility is for a portion of the light output of the excitation laser 70 to be used as a synchronous pump energy source for the quenching laser 71 (or vice versa). Another possibility is to provide a single laser which emits ultrashort pulses in the near i.r., for example the 1.3 µm output of a Cr-forsterite laser in a self-modelock configuration, or the 1.5 µm, 2 ps, 27 MHz output of a Er, Yb doped fiber laser (Laser Focus World, July 1993 p. 15) and split the output into a portion directed through a frequency doubler crystal and a frequency tripler crystal to derive the quenching and excitation beams respectively. Furthermore, the recently commercially available optical parametric oscillator coherent light sources intrinsically produce simultaneous outputs at several wavelengths, which, if necessary, can be frequency multiplied to the range required for excitation and quenching of the chosen photoactive molecule. Finally it has been possible to produce two color pulses from the same laser (de Barros M. R. X. and Pecker, P. C., Optics Lett. 18: 631(1993)), and the outputs could be separated by wavelength for use as the excitation and quenching beams.

As increasing demands on resolution have lead to decreased wavelengths in exposure of the photoresist, the depth of field of the imaging process has correspondingly decreased to the point where exposure of the full depth of the resist layer is difficult and where small departures from a perfectly flat field of the imaging objective or of a perfectly flat surface of the wafer can cause serious problems. Because with the present invention, near the plane of focus, excitation of photoactive molecules in the defocused regions above and below the plane of focus are quenched, it is possible to scan the wafer in the axial direction during exposure, to produce the equivalent of an extremely long depth of focus. Since means to change the focus of a wafer during photolithographic exposure are well known in the art, these have not been illustrated, but it should be understood that in any of the embodiments illustrated in this specification, the focus or axial position of the wafer may be under automatic control, either for insuring that the focused laser beam is constantly focused in or on the photoresist layer, for superimposing images at different layers in order to provide a much extended depth of field as described in this paragraph, or to employ the photolithographic process for the microfabrication of three dimensional parts.

It should also be understood that in the pulsed light embodiments of the invention, described in FIG. 7, exposure of the photoresist by two-photon interaction with the photoactive species would offer several advantages (Strickler and Webb, U.S. Pat. No. 5,289,407 (1994)). First, by restricting the action of the excitation beam to the vicinity of the focus, it facilitates the use of focusing at multiple depths in sequence to achieve high depth of field, by further eliminating out-of-focus light. Secondly, it allows excitation of photoresist formulations which would otherwise require specialized lenses and other equipment for use in the extreme ultraviolet, with lenses adapted for longer wavelengths, which therefore can be considerably improved with regard to field flatness, freedom from distortions and aberrations etc. From the point of view of excitation of the resist, the resolution using two-photon excitation is determined by the wavelength of the actual light, so does not benefit from the use of extreme ultraviolet. However, the quenching light can be used with single photon interaction, and by use of deep u.v. photoresist, quenching light, which is the limiting factor in resolution in the present invention, can then be applied in the technologically less demanding mid-ultraviolet part of the spectrum.

Figure 8:
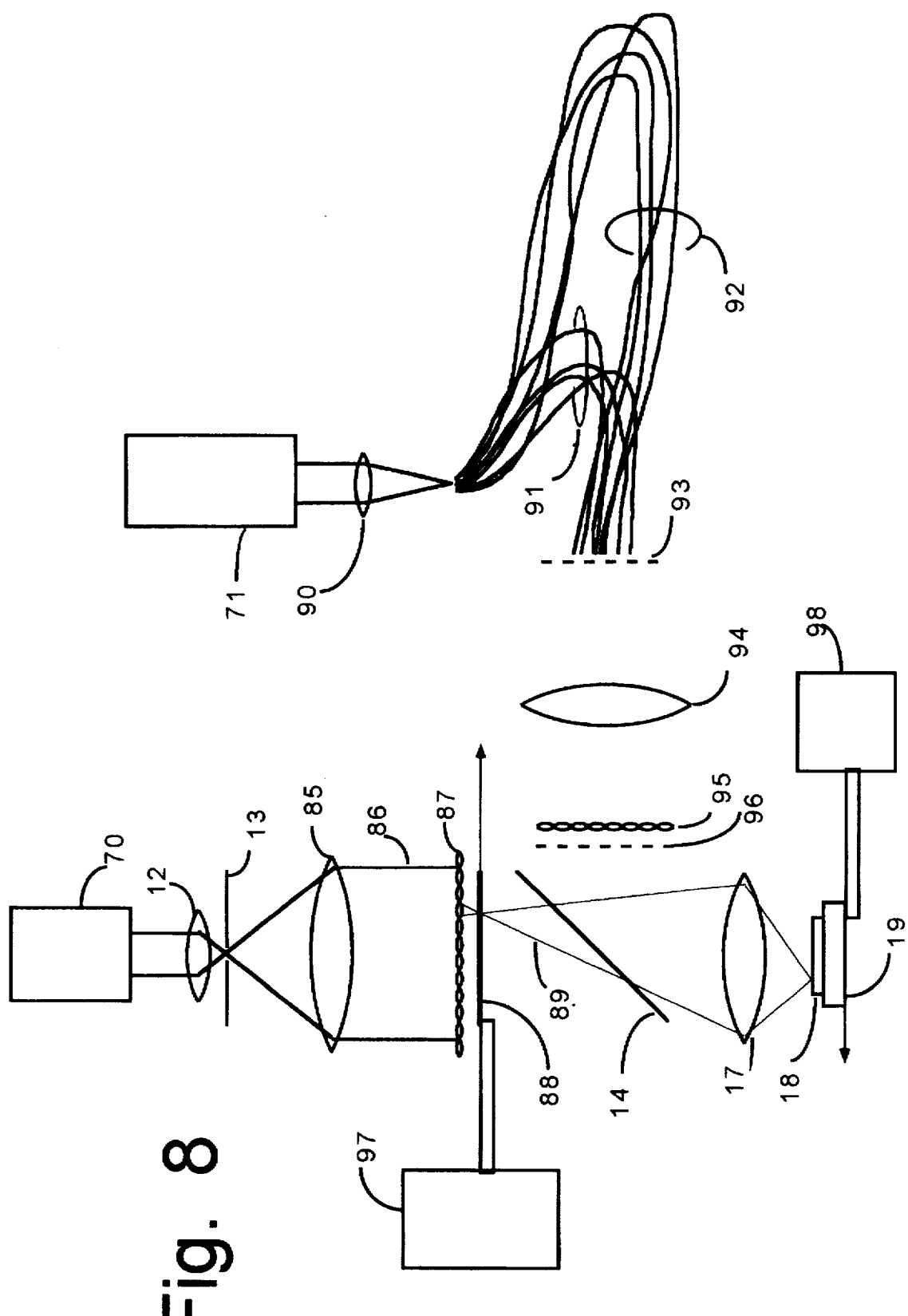
FIG. 8 is a schematic cross-sectional view of an embodiment of the present invention in which many points of a mask are simultaneously projected onto a wafer.
Figure 9:
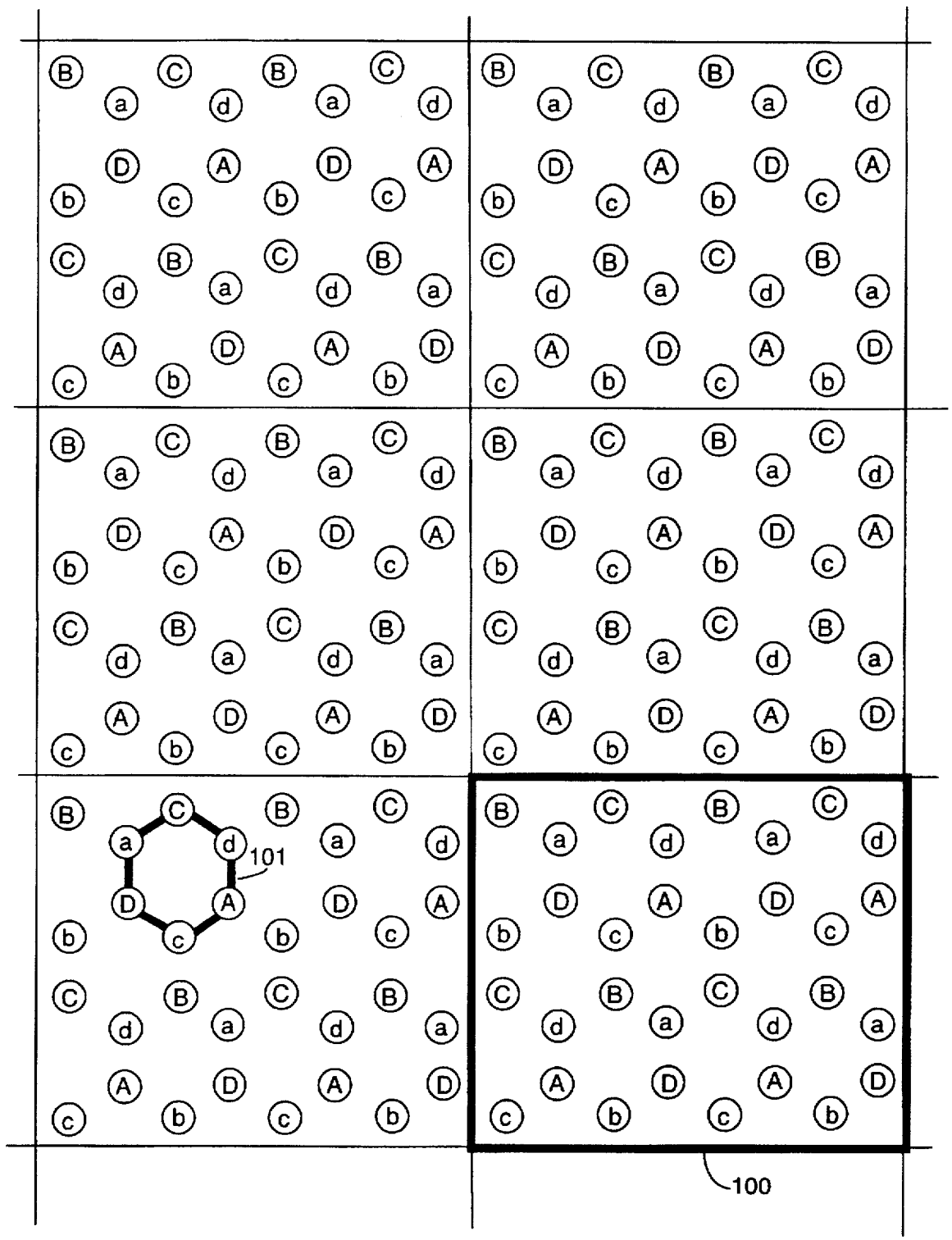
FIG. 9 is diagram showing the ends of the quenching beam optical fibers in the device of FIG. 8, in the plane conjugate to the photoresist layer.

Point scanned laser microlithographic exposure tools have an intrinsically low throughput because they apply information sequentially. FIG. 8 shows the preferred form of the present invention, which enjoys the benefits of quench sharpening, while at the same time applying an image to the wafer with massive parallelism, to achieve a high throughput. Excitation pulsed laser 70 is focused by lens 12 to a pinhole 13 and the beam emerging from pinhole 13 is collimated by lens 85 and the emerging plane wave 86 is directed on microlens array 87, which projects focused spots from laser 70 on a projection mask 88. The lenses of microlens array 87 are arranged in a regular hexagonal array, so that the spots projected onto mask 88 are at the centers of the hexagons of such an array. Where a spot of excitation light is imaged by any of the microlenses on a transparent region of mask 88, the light emerging, for example ray cone 89, passes through dichroic beam splitter 14, and is focused by lens 17 to the photoresist layer 18 on wafer 19. Because array 87 can simultaneously focus thousands of spots, an image can be transferred from the mask 88 to the photoresist layer 18 with an enormous degree of parallelism. Light from ultrafast pulsed quenching laser 71 (synchronized with laser 70 as described above) is imaged by lens 90 onto a bundle of 32 phase preserving optical fibers, arranged into four bundles of eight fibers each, two bundles 91 and 92 of which are illustrated, each with only four out of the eight fibers, to simplify the illustration. Each bundle has a different length, so that the pulses from the laser emerge at different times from each of the bundles, and therefore light emerging from fibers in one of the bundles cannot interfere with light emerging from another bundle. The rectangle 100 in the lower right corner of FIG. 9 shows the ends of each of the 32 fibers in the plane 93 of FIG. 8. The fibers in bundle 91 are schematically shown in rectangle 100 as circles with either a lower case "a" or a capital "A," those in the lower case "a" having light which emerges 180 degrees out-of-phase with respect to light emerging from the circles with capital "A." (Note that the diameters of the circles in FIG. 9 are not drawn to scale, in relationship to the dimensions of the hexagons.) Similarly, fibers in bundle 92 terminate in the circles with a lower case "b" or a capital "B," with a similar out-of-phase relationship between the lower case "b" and the capital "B" fibers, and so on for the unillustrated fibers ending in the circles with c's and d's. Light emerging from the unilluminated ends of the fibers terminating in plane 93 (which has been drawn separated from the ends of the fibers for clarity, but is actually assumed to be in the same plane with these ends), is focused to infinity by lens 94, and the light passing through lens 94 is directed onto microlens array 95, which is a rectangular array with the same aspect ratio shown in FIG. 9, and which is of the appropriate lens spacing to image the ends of the fibers at plane 93 to the repeating hexagonal pattern at plane 96 shown in FIG. 9. (One typical hexagon is labeled 101 in the figure.) The scale of the pattern at plane 96 of the focused images of the fibers at plane 93 is such that when the light leaving plane 96 is reflected from dichroic mirror 14, and imaged by lens 17 onto the photoresist layer 18, there is an image of each spot from the plane of the mask 88, where the mask is transparent, projected into the center of the image of one of the hexagons of the array of fibers conducting the quenching radiation. It should be noted that each hexagon has the same coherency and phase relationship as the device shown in FIGS. 5 and 6, namely quenching light imaged on opposite sides of the hexagon is coherent and 180 degrees out-of-phase while light imaged on adjacent vertices is mutually incoherent, in this case because the imaging occurs at different times due to the different time delays in the different fiber bundles such as bundle 91 and 92. It is assumed that the pulses from the lasers 70 and 71 are short enough, e.g., some hundreds of femtoseconds or less, that it is possible to have four different delays for the fiber bundles conducting the quenching light, so that quenching still arrives at the photoresist layer 18 before the excited state induced in the photoactive molecules by the light pulse from laser 70 has decayed either to a non-quenchable triplet excited state, or has initiated the latent image local chemical change. Therefore, provided sufficient accuracy can be provided in the fabrication of the two microlens arrays 87 and 95, and the relative phases can be maintained through the successive imaging steps for the quenching radiation, the projection in the photoresist of each hexagon provides satisfactory quench sharpening for the spot of excitation in its center.

The array of spots projected onto the photoresist layer 18 is converted into a continuous two dimensional image of the mask 88 by laterally translating the mask by motor means 97 and laterally translating the wafer 19 in the opposite direction by motor means 98, with a ratio of velocities equal to the magnification of lens 17, so that during scanning, the image of mask 88 maintains a stable relationship with the photoresist layer.

Figure 10:
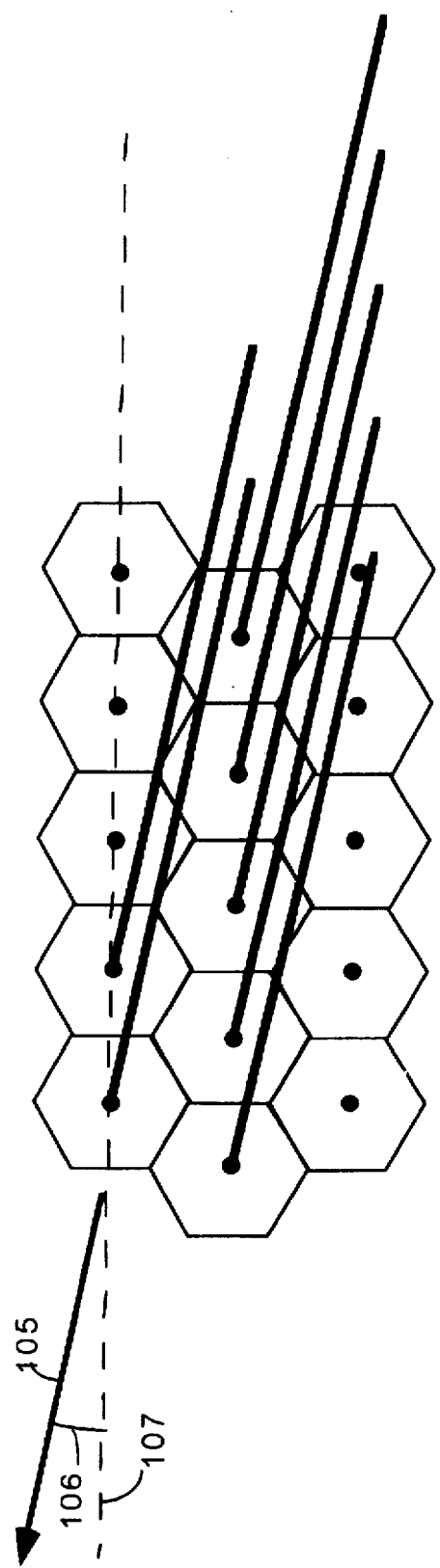
FIG. 10 is a diagram showing the direction of translation of the mask in the device of FIG. 8.

As shown diagrammatically in FIG. 10, the direction of translation of the mask (shown by arrow 105) is such that it is at a small angle 106 with respect to one of the major axes 107 of the hexagonal array of excitation spots projected by microlens array 87, so that the trajectory of two adjacent spots in the array form two parallel lines separated by less than the post-quenching resolution distance when referred to the photoresist layer, and such that by the time the entire mask has been scanned in front of the microlens array 87, the trajectories of all the excitation spots form a continuous grating pattern on the photoresist, with no gaps or regions of overlap. As is evident from FIG. 10, the angle 106 would be much smaller as the number of hexagons per row is increased from the five in the figure, to perhaps a thousand or more, as imagined for the device of FIG. 8. It is also possible to have an angle 106 which is a small multiple of the angle required for no overlap, in order to have the same point on the resist exposed by different sets of excitation/quenching microlens combinations, so that any defects in a particular microlens can be compensated by proper exposure from another microlens.

Unlike the apparatus shown in FIGS. 5 and 6, where only the contributions from six points must be considered when computing the shape of the central minimum for the quenching beam on the photoresist, in an array such as in the embodiment of FIG. 8, contributions from farther points must also be considered. Fortunately, in the case of a hexagonal array, neither the six second nearest neighboring points, nor the 12 third nearest neighboring points contribute substantially to the intensity at the central point of the central minima, because at their particular distances, they are near minima in the Airy disc distribution. Interestingly this is not the case for square arrays.

Although the full advantages of the present invention require sharpening of point images by quenching, the device of FIG. 8 offers certain advantages in the exposure of semiconductor wafers, even without use of the quench sharpening. For example if laser 70 were an excimer laser, and used without quench laser 71, because of the massive parallelism in the imaging process, the advantages of point scanning in removal of residual speckling could be combined with the ability to allow good throughput, even with a pulsed laser operating only at a few hundred Hz.

It is therefore believed that the present invention, and in particular the preferred embodiment shown in FIG. 8, may allow microchips of exceedingly fine critical dimensions to be fabricated economically, for the most part, using tool and processing components currently in place at chip fabricating facilities. Because these chips would not have to be exposed to ionizing radiation in the exposure of the photoresist, annealing steps required in chip manufacturing processes requiring ionizing radiation could be eliminated, and the resulting absence of any defects which might escape the annealing process would lead to chips of greater reliability.

While in the embodiments of the present invention described in this specification, both excitation and quenching were carried out by focused beams of light, either or both of these roles might be implemented by focused beams of other types of radiation, for example by X-rays, by focused electron or other particle beams or by focused ultrasonic radiation. In the examples given, the radiationally quenchable excited states have been electronically excited states, however any other types of excited state, including nuclear excited states, excited states involving macroscopic quantum structures, molecular isomerizations, or crystal lattice phenomena, for example, would also fall within the scope of the present invention. In the examples given, focusing of the exciting and quenching radiation is provided by lenses, however other devices for focusing are known, including concave mirrors, tapered light pipes and optical fibers, and these can be used for focusing in the present invention. The examples given have considered just one species of photoactive molecule in the photoresist, and the quenchable excited state is an excited state of this photoactive molecule, however it is possible to apply the present invention to systems where light is absorbed by a sensitizer dye, which transfers energy to a second molecule which has an excited state susceptible to radiational quenching. Alternatively the receptor molecule for the quenching photon may not be involved in the chain between absorption of the excitatory photon and the triggering of the latent image, but may be a separate molecular species which is stimulated by the quenching photon to form a chemical species which inhibits some crucial chemical link between the photoactive molecule and formation of the latent image, for example inhibiting an amplifying chain reaction. In the example given the microlithography was performed as part of the manufacture of a semiconductor chip, however substantially similar processes can be employed in making optical information storage media, nanomachined parts, and other articles. Also, many processes other than photolithography can be improved by resolution enhancement provided by quenching as taught in the present invention. Thus the scope of the invention should be determined by the appended claims and their legal equivalents, rather than by the examples given.

I claim:

1. In apparatus adapted for photolithography for irradiating a selected region of a radiationally sensitive layer containing a radiationally excitable species, members of said species being adapted, within a brief interval after becoming so excited, to produce a change in at least one local property in said layer, including a source of exciting radiation adapted to excite said members and focusing means to focus said radiation to a pattern having a central maximum at said selected region, a method of increasing the resolution of said apparatus including the steps of:

providing an excitable species, such that in addition to being adapted to becoming excited by the exciting radiation, members of the species are also adapted to loosing their excitation by exposure to quenching radiation of an appropriate wavelength during the interval between excitation and the production of said change in local properties;

providing quenching radiation adapted to radiationally deexcite the excitation of said members, thereby preventing them from leading to said change in local properties in said layer;

shaping said quenching radiation into a pattern with a central minimum, whereby within the central minimum, the intensity of quenching radiation generally increases with distance from the center of the central minimum;

overlapping said central minimum with said central maximum, whereby the center of said central minimum substantially coincides with the center of said central maximum and whereby, within said central minimum, an excited member of said species is quenched by said quenching radiation with an efficiency which generally increases with the distance of said member from the center of said central minimum; and scanning said irradiated region over a chosen part of said radiationally sensitive layer, while said central maximum of exciting radiation and said central minimum of quenching radiation remain overlapping, thereby creating a high resolution image in the layer.

2. The method of claim 1, wherein said radiationally sensitive layer is a photoresist layer and where the object of said method is to economically produce microchips with extremely small critical dimensions.

3. The method of claim 2, including the step of providing a photoresist layer which is highly transparent at the wavelength of said quenching radiation.

4. Microchips made by the method of claim 2.

5. The method of claim 1, wherein the step of shaping said quenching radiation includes the additional steps of focusing at least two sources of quenching radiation onto said material, so that the images of said sources are offset from the central maximum by equal distances on opposite sides of the central maximum, and so that for each of said sources the first minimum in the image focused onto said material coincides with said central maximum.

6. The method of claim 5, including the additional step of making the light emanating from one of said-sources of quenching radiation coherent with and out-of-phase with the light emanating from the other of said sources of quenching radiation.

7. The method of claim 1, wherein said step shaping said quenching radiation into a pattern with a central minimum includes the step of passing said quenching radiation through a plurality of optical fibers, each of said fibers having an exit end where the quenching radiation exits the fiber, such that said exit ends are spaced from an optical axis.

8. The method of claim 1 wherein said apparatus is adapted to simultaneously irradiate a plurality of non-adjacent regions in said radiationally sensitive layer with exciting radiation, and includes the additional steps of forming in each of said regions a central maximum of exciting radiation, and for each of said irradiated regions, directing said quenching radiation so that a central minimum of quenching radiation overlaps with the central maximum in the region, thereby simultaneously improving the resolution in the excitation for each of the irradiated regions.

9. The method of claim 8 wherein at any given time said regions are substantially at the centers of the hexagonal cells of a regular hexagonal array.

10. The method of claim 1 wherein the shortest dimension of said layer defines a depth axis, and where said scanning is in a plane substantially perpendicular to said depth axis.

11. The method of claim 1 wherein said scanning is in three dimensions.

12. The method of claim 1, including the additional steps of delivering said exciting radiation in short pulses and delivering said quenching radiation in short pulses which follow said pulses of exciting radiation.

13. The method of claim 11 wherein a single laser provides both the exciting radiation and the quenching wavelength, and including the steps of deriving at least two beams from said laser and changing the wavelength of at least one of said beams.

14. The method of claim 1 wherein said exciting radiation excites members of said species by a two-photon process.

15. The method of claim 1 wherein said focusing means has at least one aperture plane, and includes an annular aperture at said aperture plane.

16. The method of claim 12 and including the step of producing at least two mutually coherent beams of quenching radiation directed at said layer, and delaying one of these beams relative to the other beam so that the delayed beam arrives at said layer after the offset of said other beam, such that within the layer the beams are effectively mutually incoherent because they cannot interfere.

17. The method of claim 2 wherein an object is to avoid exposure of the photoresist layer to ionizing radiation while creating microchips of exceedingly small critical dimensions.

18. Microchips made by the method of claim 17.

19. In apparatus adapted to the group of arts consisting of microlithography, nanofabrication, microfabrication and optical storage of information, such apparatus being adapted for irradiating a selected region of a radiationally sensitive layer containing a radiationally excitable species in order excite members of said species, members of said species being adapted, within a brief interval after becoming so excited, to produce a change in at least one local property in said layer, including a source of exciting radiation adapted to excite said members and focusing means to focus said radiation to a pattern having a central maximum at said selected region, a method of increasing the resolution of said apparatus including the steps of:

providing an excitable species, so that in addition to being adapted to becoming excited by the exciting radiation, members of the species are also adapted to loosing their excitation by exposure to quenching radiation of an appropriate wavelength during the interval between excitation and the production of said change in local properties;

providing quenching radiation adapted to radiationally deexcite the excitation of said members, thereby preventing them from leading to said change in local properties in said layer;

shaping said quenching radiation into a pattern with a central minimum, whereby within the central minimum, the intensity of quenching radiation generally increases with distance from the center of the central minimum;

overlapping said central minimum with said central maximum, whereby the center of said central minimum substantially coincides with the center of said central maximum and whereby, within said central minimum, an excited member of said species is quenched by said quenching radiation with an efficiency which generally increases with the distance of said member from the center of said central minimum; and scanning said irradiated region over a chosen part of said radiationally sensitive layer, while said central maximum of exciting radiation and said central minimum of quenching radiation remain overlapping, thereby creating a high resolution image in the layer.

20. In apparatus adapted for photolithography for irradiating a selected region of a radiationally sensitive layer containing a radiationally excitable species, members of said species being adapted, within a brief interval after becoming so excited, to produce a change in at least one local property in said layer, including a source of exciting radiation adapted to excite said members and focusing means to focus said radiation to a pattern having a central maximum at said selected region, means of increasing the resolution of said apparatus including:

an excitable species in said layer, such that in addition to being adapted to becoming excited by the exciting radiation, members of the species are further adapted to loosing their excitation by exposure to quenching radiation of an appropriate wavelength during the interval between excitation and the production of said change in local properties;

a source of quenching radiation adapted to radiationally deexcite the excitation of said members, thereby preventing them from leading to said change in local properties in said layer;

means for shaping said quenching radiation into a pattern with a central minimum, whereby within the central minimum, the intensity of quenching radiation generally increases with distance from the center of the central minimum;

means for overlapping said central minimum with said central maximum, whereby the center of said central minimum substantially coincides with the center of said central maximum and whereby, within said central minimum, an excited member of said species is quenched by said quenching radiation with an efficiency which generally increases with the distance of said member from the center of said central minimum; and means for scanning said irradiated region over a chosen part of said radiationally sensitive layer, while said central maximum of exciting radiation and said central minimum of quenching radiation remain overlapping, thereby creating a high resolution image in the layer.

* * * * *